United States Patent [19]

Cabot

[11] Patent Number: 4,631,522
[45] Date of Patent: Dec. 23, 1986

[54] METHOD AND CIRCUIT FOR COMPENSATION OF A MULTIPLYING DIGITAL-TO-ANALOG CONVERTER

[75] Inventor: Richard C. Cabot, Beaverton, Oreg.

[73] Assignee: Audio Precision, Inc., Beaverton, Oreg. ; a part interest

[21] Appl. No.: 722,858

[22] Filed: Apr. 12, 1985

[51] Int. Cl.[4] .............................................. H03K 13/02
[52] U.S. Cl. ........................ 340/347 CC; 340/347 DA
[58] Field of Search .................. 340/347 DA, 347 CC

[56] References Cited

U.S. PATENT DOCUMENTS 4,410,880 10/1983 Zaborowski ................ 340/347 DA

FOREIGN PATENT DOCUMENTS 0702512 12/1979 U.S.S.R. .
0822208 4/1981 U.S.S.R. .
1035788 8/1983 U.S.S.R. .

OTHER PUBLICATIONS

"CMOS Hybrid MDAC Serves as Replacement for Monolithic Types", Comput. Design (USA) vol. 19, No. 10, Oct. 1980.

Sounders et al., "A 20 Bit + Sign, Relay Switched D/A Converter," National Bureau of Standards Tech. Note 1105, Washington, D.C. USA, Oct. 1979.

Primary Examiner—William M. Shoop, Jr.
Assistant Examiner—Sharon D. Logan
Attorney, Agent, or Firm—William A. Birdwell

[57] ABSTRACT

A method and circuit for reducing the effect of variations in resistances within a multiplying digital-to-analog converter. A first resistor is connected at one end to the feedback resistor of the MDAC, the other end providing a compensated circuit input. A second resistor is connected from the MDAC input to the feedback resistor. The MDAC output to which the feedback resistor is internally connected is connected to the MDAC reference connection, the other output providing a compensated circuit output. The first and second resistors are chosen such that the product of their resistances is equal to the product of the feedback resistance times the MDAC input resistance.

5 Claims, 4 Drawing Figures

U.S. Patent  Dec. 23, 1986  4,631,522
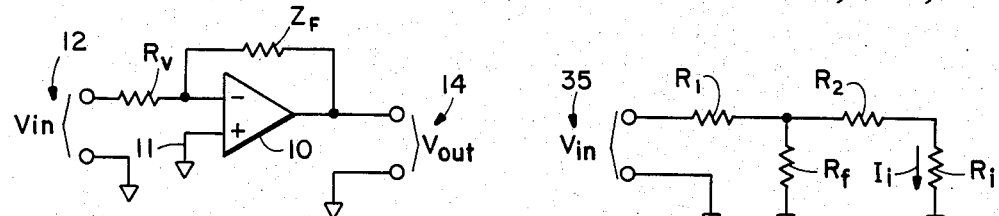
FIG. 1
FIG. 3
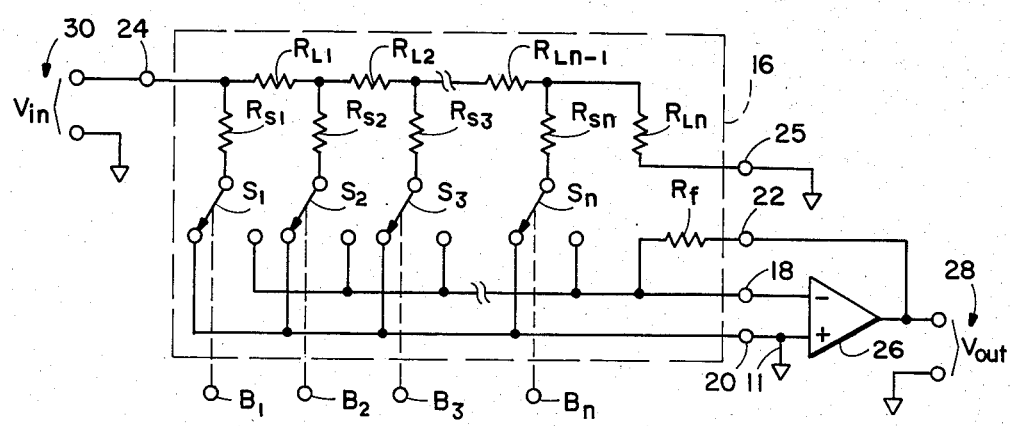
FIG. 2
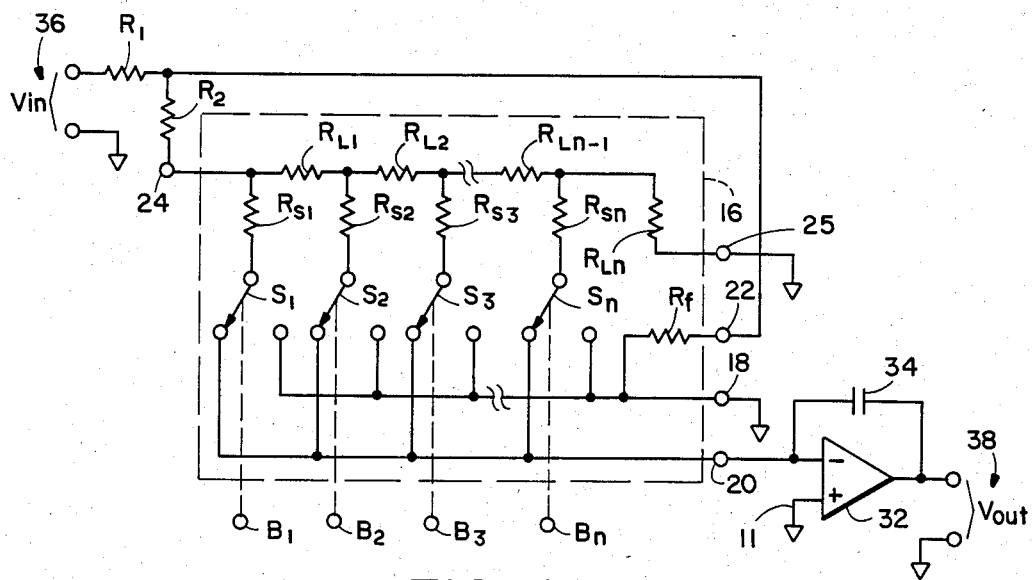
FIG. 4

METHOD AND CIRCUIT FOR COMPENSATION OF A MULTIPLYING DIGITAL-TO-ANALOG CONVERTER

BACKGROUND OF THE INVENTION

This invention relates to circuits for compensating for variations in electronic component parameters with time and temperature, particularly to a circuit for reducing the effect of changes in resistances within a multiplying digital-to-analog converter.

CMOS multiplying digital-to-analog converters ("MDACs") are used for many applications requiring an adjustable gain stage. The MDAC ordinarily provides the input and feedback resistors for a conventional linear operational amplifier circuit, the MDAC permitting the input resistance to be digitally selected in response to a binary input signal. The MDAC is made of semiconductor resistance elements and CMOS FET switches in a standard ladder configuration.

The resistance of semiconductor resistors varies greatly with temperature and time. This variation is on the order of 30% of their nominal value. However, since a feedback resistor is included in an MDAC and the feedback resistor is made of the same material as the ladder network, where the MDAC is used in a conventional linear operational amplifier circuit the variation in resistance of the input resistor is cancelled out by the variation in resistance of the feedback resistor, and the gain of the amplifier is dependent only on the settings of the FET switches.

However, there are circuit applications where it is desirable to use an MDAC other than in a linear operational amplifier having a selectable input resistor and a feedback resistor provided by the MDAC. For example, it is often desirable to use an integrator having a selectable input resistor and a capacitor as a feedback element. Since the feedback resistor of an MDAC cannot be employed to provide feedback in such applications, the use of an MDAC in such applications is prone to produce large inaccuracies.

It would be desirable to have a circuit that would compensate for variations in the resistances of an MDAC without requiring that its feedback resistor be used as the feedback element of a linear operational amplifier circuit.

SUMMARY OF THE INVENTION

The present invention provides a circuit for reducing the effect of variations in resistance of the resistance elements of an MDAC without requiring that the feedback resistor of the MDAC be used as a feedback resistor in a linear operational amplifier circuit. Rather, a first resistor is connected to the MDAC feedback resistor to form a first L-pad, and a second resistor is connected from the feedback resistor to the input of the MDAC to form a second L-pad cascaded with the first. As the MDAC input resistance varies with temperature and time, the feedback resistor varies in a like manner which, due to the cascaded L-pads, tends to maintain the input current to the MDAC constant.

The first and second compensation resistors are chosen such that the product of their resistances is equal to the product of the nominal MDAC input and feedback resistances. While there is a loss of compensated circuit gain resulting from the use of this compensation scheme, the compensated circuit gain can be maximized by setting the resistance of the first resistor equal to the quotient of the feedback resistance divided by the square root of two and the resistance of the second resistor equal to the product of the feedback resistance times the square root of two, where the input and feedback resistance are equal, as is customary.

Accordingly, it is a principal objective of the present invention to provide a novel method and circuit for reducing the effect of variations in resistances within a multiplying digital-to-analog converter.

It is another objective of the present invention to provide such a method and apparatus wherein the feedback resistor of an MDAC is used to vary the voltage applied to the input of the MDAC as internal resistances vary so as to tend to maintain a constant input current to the MDAC.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 illustrates a typical operational amplifier circuit wherein the amplifier gain is selectively variable.

FIG. 2 shows a typical operational amplifier circuit wherein the gain is selectively variable, including a typical multiplying digital-to-analog converter circuit to select the gain.

FIG. 3 illustrates the basic topology of a circuit according to the present invention.

FIG. 4 shows an embodiment of a circuit according to the present invention employed in an integrator application.

DETAILED DESCRIPTION OF THE INVENTION

Referring to FIG. 1, a typical operational amplifier circuit employs an operational amplifier 10 having an output, an inverting input, and a non-inverting input. The non-inverting input is connected to a reference 11. A feedback impedance $Z_f$ is connected from the output to the inverting input, and an input resistance $R_v$ is connected from the non-inverting input of the operational amplifier to the circuit input 12. Thus, the voltage transfer function of the circuit from the input 12 to the output 14 may be expressed by the following equation:

$$V_{out}/V_{in} = Z_f/R_v$$

In many simple linear operational amplifier circuit applications both $Z_f$ and $R_v$ are resistors, $R_v$ being variable in order to vary the gain of the operational amplifier circuit.

Turning to FIG. 2, a common means of varying the input resistor to a linear operational amplifier circuit is to employ a CMOS multiplying digital-to-analog converter ("MDAC"). A typical MDAC is shown in FIG. 2 by the circuitry within the dashed line 16. As is commonly known in the art, the MDAC comprises a set of first semiconductor resistance elements $R_{L1}$-$R_{Ln}$ connected together in series, one end of the series being connected to the MDAC input connection 24 and the other to the MDAC reference connection 25. The MDAC also includes a set of second semiconductor resistance elements $R_{S1}$-$R_{Sn}$ connected respectively to the input end of corresponding series resistance elements. These resistance elements form a standard ladder network.

The other end of each of the second resistance elements is connected to a respective CMOS FET switch $S_1$-$S_n$ for selectively connecting its respective second resistance element to a first output connection 18 or a second output connection 20. The switches $S_1$-$S_n$ are actuated by respective inputs $B_1$-$B_n$, corresponding to bits of a digital input word, as is commonly known in the art. For typical operational amplifier applications, the MDAC is also provided with a feedback resistor $R_f$ connected between output connection 18 and a feedback connection 22. (The term "feedback connection" is used hereinafter for convenience despite that the feedback resistor may not be used as part of a feedback circuit.) In such a circuit the output analog variable, i.e. output voltage, is equal to the product of a number (proportional to the number represented by an input digital code) and an analog reference value, i.e. input voltage. The digital number is represented by the bits $B_1$-$B_n$. A typical example of such a device is an AD 7523 CMOS 8-Bit Multiplying D/A Converter manufactured by Analog Devices, Inc., Route 1, Industrial Park, Norwood Mass., U.S.A.

Ideally, the output current of the MDAC should not vary with temperature or time, but should solely be a function of the input current and the input digital word. In a typical application, as shown in FIG. 2, the MDAC is used to vary the effective input resistance $R_v$ of an operational amplifier circuit of the type shown in FIG. 1. Thus, the outputs 18 and 20 of the MDAC in FIG. 2 are connected to an operational amplifier 26 and $R_f$ provides the feedback resistor for that operational amplifier circuit. By changing the input digital word to the MDAC the gain of the resultant operational amplifier circuit, that is, the ratio of the voltage $V_{out}$ at output 28 to the voltage $V_{IN}$ at input 30 can be varied. At the same time, by including the feedback resistor $R_f$ as part of the MDAC, such that it has the same temperature and time characteristics as the other resistance elements in the MDAC, the gain of the operational amplifier circuit is substantially uneffected by temperature and time.

A problem results, however, where the feedback impedance needed for an operational amplifier is not purely resistive. In that case, the feedback resistor of an MDAC cannot be used as the feedback impedance. This is the case, for example, with a typical integrator where the feedback impedance of an operational amplifier is a capacitor. Under such conditions, the MDAC is not automatically temperature compensated.

A topology for solving the foregoing problem according to the present invention is shown in FIG. 3. In this figure $R_f$ represents the feedback resistor in a typical MDAC and $R_i$ represents the input resistance of the MDAC measured with respect to the reference connection 25, assuming that the two outputs 18 and 20 are connected to the reference connection. (This is ordinarily the case in the use of an operational amplifier since the reference is ordinarily connected to ground and the inputs of the operational amplifier are virtually at ground potential.) A first L-pad is formed by a resistor $R_1$ and the feedback resistance element $R_f$. A second L-pad, cascaded to the first, is formed by a resistor $R_2$ and the input resistance $R_i$ of the MDAC. The object is to maintain the current in $R_i$ as nearly constant with temperature and time as possible. By employing $R_2$ to adjust the voltage cross $R_i$ as $R_i$ changes, and by employing $R_1$ and $R_f$ to adjust the voltage applied to $R_2$, the effect of time and temperature on the current through $R_i$ is greatly reduced. For example, as $R_i$ decreases, the current through $R_i$ will increase, but that increase is reduced by the presence of $R_2$ which drops the voltage across $R_i$. Moreover, as $R_i$ decreases $R_f$ also decreases, since it is constructed of the same material in the same MDAC, which reduces the voltage applied to $R_2$, further reducing the change of current in $R_i$.

Although MDACs are conventional designed so that their input resistance $R_i$ is equal to their feedback resistance $R_f$, it is conceivable that those resistances would differ. Assuming that $R_f = AR_i$, where A is a constant, it can be shown that:

$$I_i/V_{IN} = AR_i/AR_iR_2 + AR_i^2 + AR_iR_1 + R_1R_2 + R_iR_1$$

Where:
$V_{IN}$ = the voltage applied to the input 35 in FIG. 3; and
$I_i$ = current through $R_i$ in FIG. 3, i.e., the input current to the MDAC.

It can also be shown that the change in $I_i/V_{IN}$ will be minimized where:

$$R_fR_i = R_1R_2$$

In the case where $R_f = R_i$, as is conventional, it can be shown that minimum loss of gain through the MDAC as a result of the compensation resistors will occur where:

$$R_1 = \frac{1}{\sqrt{2}} R_f$$

and $$R_2 = \sqrt{2}\, R_f$$

It is to be recognized that $R_f$ and $R_i$ have only nominal values for purposes of these computations, the actual values varying with temperature and time. However, assuming $R_f = R_i = 1$ as a nominal value, but an actual variance 0.5 to 1.5 (i.e., a 50% variance), then Table 1 shows the effect of a compensation circuit constructed for minimal loss of gain.

TABLE 1

| $R_f$ | Percent Error of $R_f$ | Percent Error of Gain |
|---|---|---|
| 0.5 | 50 | 10.36 |
| 0.6 | 40 | 5.52 |
| 0.7 | 32 | 2.66 |
| 0.8 | 20 | 1.04 |
| 0.9 | 10 | .23 |
| 1.0 | 0 | 0 |
| 1.1 | 10 | .19 |
| 1.2 | 20 | .69 |
| 1.3 | 30 | 1.43 |
| 1.4 | 40 | 2.37 |
| 1.5 | 50 | 3.45 |

Thus, it can be seen that a substantial increase in compensated circuit accuracy is obtained.

Turning to FIG. 4, the topology of the present invention is applied to a specific embodiment producing an integrator. In this case, output 20, rather than output 18, of the MDAC 16 is applied to the inverting input of an operational amplifier 32. The non-inverting input being connected to the reference 11. The feedback for the operational amplifier is supplied by a capacitor 34, making the circuit an integrator. Resistor $R_1$ is connected from the circuit input 36 to the feedback connection 22 of the MDAC, and hence to the feedback resistor $R_f$. Output 18 of the MDAC is connected to the reference, thereby connecting the other end of $R_f$ to the reference. The resistor $R_2$ is connected from the MDAC input connection 24 to the MDAC feedback connection 22, thereby completing the topology set forth in FIG. 3. Thus, the output 38 is the integral of the input 36, the digital input word represented by bits $B_1-B_n$ serving to vary the input resistance to the operational amplifier 32 and therefore the integration time constant.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follows.

I claim:

1. A compensation circuit for reducing the effect of variations in resistance values of circuit elements within a multiplying digital-to-analog converter having a ladder resistor network comprising a plurality of first resistance elements connected together in series, with one end of said series providing a converter input connection and the other end of said series providing a reference connection, and a corresponding plurality of second resistance elements each connected at one end thereof to the input end of a respective first resistance element, a plurality of switch means, each connected to the other end of a respective second resistance element, for selectively connecting said second resistance elements to one of a first or a second output connection, and a feedback resistance element connected at one end to said first output connection and at its other end to a feedback connection, said converter having a converter input resistance defined as the resistance from said input connection to said reference connection with both said first and said second output connections connected to said reference connection, and a feedback resistance defined as the resistance from said feedback connection to said first output connection, said compensation circuit comprising:
   (a) a first resistor connected at one end to said feedback connection, the other end providing a compensated circuit input connection; and
   (b) a second resistor connected at one end to said feedback connection and at the other end to said converter input connection, said first output connection being connected to said reference connection, the product of the resistances of said first and second resistors being equal to the product of said converter input resistance and said feedback resistance, and said second output connection providing a compensated circuit output connection.

2. The compensation circuit of claim 1 wherein each said switch means includes means responsive to a binary input signal for actuating said switch means to select said first or said second output connection.

3. The compensation circuit of claim 1 wherein said converter input resistance is equal to said feedback resistance, said first resistor has a resistance equal to the quotient of said feedback resistance divided by the square root of two, and said second resistor has a resistance equal to the product of said feedback resistance times the square root of two.

4. A method for reducing the effect of variations in resistance values of circuit elements within a multiplying digital-to-analog converter having a ladder resistor network comprising a plurality of first resistance elements connected together in series, with one end of said series providing a converter input connection and the other end of said series providing a reference connection, and a corresponding plurality of second resistance elements each connected at one end thereof to the input end of a respective first resistance element, a plurality of switch means, each connected to the other end of a respective second resistance element, for selectively connecting said second resistance elements to one of a first or a second output connection, and a feedback resistance element connected at one end to said first output connection and at its other end to a feedback connection, said converter having a converter input resistance defined as the resistance from said input connection to said reference connection with both said first and said second output connections connected to said reference connection, and a feedback resistance defined as the resistance from said feedback connection to said first output connection, said method comprising:
   (a) connecting one end of a first resistor to said feedback connection, the other end providing a compensated circuit input connection;
   (b) connecting said first output connection to said reference connection; and
   (c) connecting one end of a second resistor to said feedback connection and the other end to said converter input connection, the product of the resistances of said first and second resistors being equal to the product of said converter input resistance and said feedback resistance, said second output connection providing a compensated circuit output connection.

5. The method of claim 4 wherein said input resistance is equal to said feedback resistance, said first resistor has a resistance equal to the quotient of said feedback resistance divided by the square root of two, and said second resistor has a resistance equal to the product of said feedback resistance times the square root of two.

* * * * *